United States Patent
Schuurmans

(10) Patent No.: US 9,048,861 B2
(45) Date of Patent: Jun. 2, 2015

(54) ANALOGUE TO DIGITAL CONVERTER

(71) Applicant: NXP B.V., Eindhoven (NL)

(72) Inventor: Han Martijn Schuurmans, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/473,486

(22) Filed: Aug. 29, 2014

(65) Prior Publication Data

US 2015/0097711 A1 Apr. 9, 2015

(30) Foreign Application Priority Data

Oct. 9, 2013 (EP) ..................................... 13187912

(51) Int. Cl.
*H03M 3/00* (2006.01)

(52) U.S. Cl.
CPC .............. *H03M 3/496* (2013.01); *H03M 3/462* (2013.01); *H03M 3/39* (2013.01)

(58) Field of Classification Search
CPC ........... H03M 3/34; H03M 3/37; H03M 3/44; H03M 3/428; H03M 3/452; H03M 3/464; H03M 3/424; H03M 3/434; H03M 3/39; H03M 3/462; H03M 3/496
USPC ................................................ 341/143–155
See application file for complete search history.

(56) References Cited

U.S. PATENT DOCUMENTS 6,404,368 B1 * 6/2002 Yamaguchi .................... 341/143
8,223,051 B2 * 7/2012 Van Veldhoven ............. 341/143
2005/0080494 A1 * 4/2005 Melanson ......................... 700/55
2008/0272946 A1 * 11/2008 Melanson ...................... 341/143
2009/0079606 A1 * 3/2009 Terry et al. .................... 341/143
2011/0012766 A1 * 1/2011 Van Veldhoven ............. 341/143

FOREIGN PATENT DOCUMENTS

EP 2 421 156 A2 2/2012

OTHER PUBLICATIONS

Rocha, D. et al. "Architectures for A/D Conversion with Optimal Use of Oversampling", IEEE Int. Symp. on Circuits and Systems, pp. 37-40 (May 1996).

(Continued)

*Primary Examiner* — Lam T Mai

(57) ABSTRACT

An analog to digital converter comprises an input terminal configured to receive an analog input signal and an output terminal configured to provide an output digital signal. The analog to digital converter also comprises a main summer having a summing input, a subtracting input and a summing output, wherein the summing input is connected to the input terminal; an analog filter having a filter input and a filter output, wherein the filter input is connected to the summing output; a quantizer having a quantizer input and a quantizer output, wherein the quantizer input is connected to the filter output; a digital integrator having a digital integrator input and a digital integrator output, wherein the digital integrator output is configured to provide a multi-bit output signal, the digital integrator input is connected to the quantizer output, and the digital integrator output is connected to the output terminal; and a main feedback digital to analog converter having a main feedback converter input and a main feedback converter output, wherein the main feedback converter input is connected to the digital integrator output, and the main feedback converter output is connected to the subtracting input of the main summer.

16 Claims, 2 Drawing Sheets

(56) References Cited

OTHER PUBLICATIONS

Dorrer, L. et al. "A 3mW 74dB SNR 2MHz Continuous-Time Delat-Sigma ADC with a Tracking ADC Quantizer in 0.13-μm CMOS", IEEE Int. Solid-State Circuits, vol. 48, No. 12 pp. 2416-2427 (Dec. 2005).

Extended European Search Report for EP Patent Appln. No. 13187912.4 (Mar. 4, 2014).

* cited by examiner

ANALOGUE TO DIGITAL CONVERTER

CROSS-REFERENCE TO RELATED APPLICATIONS

This application claims the priority under 35 U.S.C. §119 of European patent application no. 13187912.4, filed on Oct. 9, 2013, the contents of which are incorporated by reference herein.

This disclosure relates to analogue to digital converters (ADCs), and particularly, although not exclusively, to ADCs, including sigma delta ADCs, that are configured to operate at low output sample rates to enable low power decimation.

Sigma delta analogue to digital converters (ADCs) and digital to analogue converters (DACs) may be collectively referred to as sigma delta converters, and are widely used in high-precision, low to medium bandwidth applications. Sigma delta modulation (SDM) may be used to encode analogue signals into digital signals. The conversion is achieved using error feedback, where the difference between the two signals is measured and used to improve the conversion.

According to a first aspect of the invention there is provided an analogue to digital converter comprising:
 an input terminal configured to receive an analogue input signal;
 an output terminal configured to provide an output digital signal;
 a main summer having a summing input, a subtracting input and a summing output, wherein the summing input is connected to the input terminal;
 an analogue filter having a filter input and a filter output, wherein the filter input is connected to the summing output;
 a quantizer having a quantizer input and a quantizer output, wherein the quantizer input is connected to the filter output;
 a digital integrator having a digital integrator input and a digital integrator output, wherein the digital integrator output is configured to provide a multi-bit output signal, the digital integrator input is connected to the quantizer output, and the digital integrator output is connected to the output terminal; and
 a main feedback digital to analogue converter having a main feedback converter input and a main feedback converter output, wherein the main feedback converter input is connected to the digital integrator output, and the main feedback converter output is connected to the subtracting input of the main summer.

The forward (non-feedback) branch of the ADC may be considered to comprise the analogue filter, the quantizer, and the digital integrator. Splitting this forward branch into an analogue portion (comprising the filter) and a digital portion (comprising the quantizer, and the digital integrator), can allow improved scalability while stability is maintained. Parameters of the digital portion can scale with the sample rate, therefore allowing different sample rates to be used without requiring reconfiguration. The analogue portion can be stable under different sample rates. It may be advantageous for an ADC to be stable at different frequencies so that it may be used in different applications, for example for both speech/voice-band processing (typically operating around 8 kHz) and high-end audio applications (typically operating around 48 kHz).

Advantageously, the use/amount of analogue circuitry in such an ADC may be reduced. For example, the analogue circuitry in the ADC may be the analogue filter (such as a first order filter) followed by the quantizer. To provide sufficient resolution (that is, a low level of quantization noise and a high dynamic range) the digital integrator followed by the main feedback DAC (which may be a multi-bit DAC) are included in the ADC to increase the resolution of the circuit with multiple bits. The overall ADC loop may be second order.

The digital integrator may be a multi-bit up/down counter.

The main feedback digital to analogue converter may be configured to receive the multi-bit output signal from the digital integrator output.

The analogue to digital converter may further comprise a digital sigma delta modulator block having a digital modulator input and a digital modulator output. The digital modulator input may be connected to the digital integrator output and the digital modulator output may be connected to both the output terminal and the main feedback converter input.

The main feedback digital to analogue converter may be a finite impulse response digital to analogue converter (FIR-DAC).

Use of the digital sigma delta modulator block and the finite impulse response digital to analogue converter may allow for a multi-level feedback signal having sufficient resolution, that is, the overall ADC can meet a required product specification, and has a resolution such that it provides an acceptably low level of quantization noise and an adequately high dynamic range for practical use.

The analogue to digital converter may comprise an intermediate feedback digital to analogue converter having an intermediate feedback converter input and an intermediate feedback converter output. The intermediate feedback converter input may be connected to the quantizer output. The analogue to digital converter may further comprise an intermediate summer having a first intermediate summing input, a second intermediate summing input and an intermediate summing output. The first intermediate summing input may be connected to the main feedback converter output. The second intermediate summing input may be connected to the intermediate feedback converter output. The intermediate summing output may be connected to the subtracting input of the main summer.

The split/branch at the output of the quantizer creates a loop comprising the analogue filter, quantizer and intermediate feedback DAC which may be a first order loop. This first order loop provides stability in the ADC. A remaining digital portion of the ADC comprising the digital integrator, digital SDM block and main feedback DAC can provide a sufficiently wide dynamic range for the ADC.

The intermediate feedback digital to analogue converter may be a 1-bit digital to analogue converter. The main feedback digital to analogue converter may be a multi-bit digital to analogue converter.

The analogue to digital converter may further comprise first and second digital sigma delta modulator blocks. The first digital sigma delta modulator block may have a first digital modulator input and a first digital modulator output. The first digital modulator input may be connected to the digital integrator output and the first digital modulator output may be connected to the main feedback converter input. The second digital sigma delta modulator block may have a second digital modulator input and a second digital modulator output. The second digital modulator input may be connected to the digital integrator output and the second digital modulator output may be connected to the output terminal.

The first digital sigma delta modulator block may be a lower order than the second digital sigma delta modulator block. For example, the first digital sigma delta modulator block may be a third order modulator block, and the second digital sigma delta modulator block may be a fifth order modulator block. By using a second digital sigma delta modulator block, connected to the output terminal, with a higher order than the first digital sigma delta modulator block, connected in the feedback loop, the output sample rate can be at a lower sample rate than that required to enable low power decimation.

The first digital sigma delta modulator block may be configured to operate at an oversampling frequency that is higher than the oversampling frequency at which the second digital sigma delta modulator block is configured to operate.

A high oversampling ratio may lead to high power dissipation of a decimator at the output of the ADC. By using a first digital sigma delta modulator block having a higher sampling frequency and a second digital sigma delta modulator block having a lower sampling frequency, the feedback loop between the first digital modulator output and the subtracting input of the main summer may be run at a high oversampling ratio, while the output oversampling ratio from the second digital modulator output of the second higher order digital sigma delta modulator block can still be at a lower oversampling ratio to reduce power dissipation of the decimator.

According to a second aspect of the invention there is provided a sigma delta analogue to digital converter comprising a forward path between an input terminal and an output terminal and a feedback path, wherein the forward path comprises an analogue filter, and digital componentry configured to receive an output signal from the analogue filter and provide a multi-bit output signal.

The digital componentry may comprise a multi-bit quantizer. The digital componentry may comprise a quantizer in series with a digital integrator.

The sigma delta analogue to digital converter may further comprise a digital sigma delta modulator block configured to receive the multi-bit output signal, and provide a digital modulator output signal to the output terminal.

Embodiments will now be described by way of example with reference to the accompanying figures, in which.

Embodiments disclosed herein relate to an analogue to digital converter (ADC) having a main summer connected to an analogue filter. The analogue filter is connected to a quantizer which in turn is connected to a digital integrator. An output signal from the digital integrator is connected back to the main summer via a main feedback digital to analogue converter (DAC) and also to the output of the ADC. The ADC may be stable over a broad frequency range. The ADC may be used in applications requiring flexibility in sample rate, and may be suitable for use in low power applications, such as microphone applications for mobile phones and headsets. The ADC may also be suitable for use in more complex codec systems and application processors. The simplicity of the ADC, and examples where the ADC comprises mainly digital circuitry, means it is highly scalable and may be suitable for use in advanced processes.

ADCs may be found in mobile applications and sensors. Such devices may advantageously have low power consumption in order to have a long enough battery life for practical use. Audio ADCs may be used in microphone applications. Although a microphone may not be considered a high performance device, a high dynamic range is required to capture a wide range of sound pressure levels which the microphone can then detect.

Lower power consumption and a high dynamic range may be achieved with a time continuous sigma delta modulator (TC SDM) rather than a switched capacitor sigma delta modulator (SC SDM). A SC SDM consumes more power than a TD SDM because a SC SDM is required to carry out fast switching with high currents. However, a disadvantage of a TD SDM is that its use is limited to only a single sample rate, due to having a fixed loop filter. That is, if the sample rate changes, the filter coefficients stay the same as they are fixed. For different sample rates, the loop filter coefficients require adaptation in order to maintain loop stability and high noise shaping. TC SDMs can also be sensitive to clock jitter.

Different sample rates may be required for use in different applications. For example, for high-end audio applications and mobile applications a sample frequency of 48 kHz may be required, whereas for phone calls and other voice band applications the sample frequency may be much lower, at around 8 kHz.

It may be advantageous for an ADC to be used for both high-end and voice band applications such that the filter coefficients are changed in order to maintain loop stability for the different sampling rates. Further, it may be advantageous for an ADC to be less sensitive to clock jitter, for example less sensitive than an ADC using a TD SDM. Low jitter can be of particular interest in combined analogue/digital circuits where direct relation with a stable clock is not guaranteed. Further, maintaining a lower power consumption by the ADC may be especially advantageous in mobile devices, such as mobile telephones and audio systems.

Figure 1:
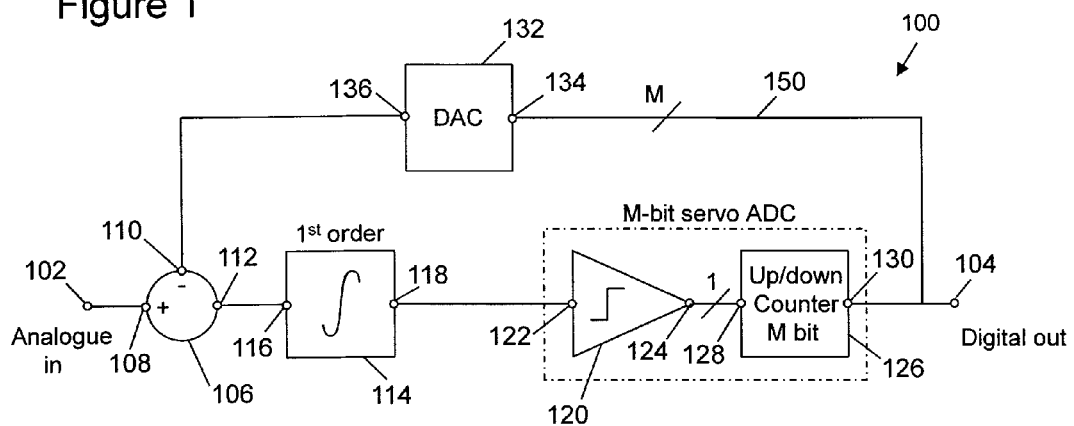
FIG. 1 illustrates a circuit diagram of an ADC comprising a multi-bit servo ADC configured to act as a multi-bit quantizer.

FIG. 1 illustrates a diagram of an analogue to digital converter (ADC) 100. An input terminal 102 is configured to receive an analogue input signal. An output terminal 104 is configured to provide an output digital signal.

The ADC 100 comprises a main summer 106 with a summing input 108, a subtracting input 110 and a summing output 112. The summing input 108 is connected to the input terminal 102 of the ADC 100.

The ADC 100 also comprises an analogue filter 114 with a filter input 116 and a filter output 118. In this example the analogue filter 114 is a first order filter. The filter input 116 is connected to the summing output 112 of the main summer 106. The analogue filter 114 may be considered to be a loop filter, or an integrator. The analogue filter 114 may have a pole at 0 Hz or higher. In some examples the filter 114 may be a capacitor.

The ADC 100 also comprises a quantizer 120 with a quantizer input 122 and a quantizer output 124. The quantizer input 122 is connected to the filter output 118 of the analogue filter 114. The quantizer 120 may be a comparator, and in some examples it may be a 1-bit quantizer.

The ADC 100 also comprises a digital integrator having a digital integrator input and a digital integrator output that provides a multi-bit output. In this example the digital integrator is a multi-bit up/down counter 126 having a counter input 128 as the digital integrator input and a counter output 130 as the digital integrator output.

The counter output 130 is configured to provide a multi-bit output signal 150. The counter input 128 is connected to the quantizer output 124 of the quantizer 120. The counter output 130 is connected to the output terminal 104 of the ADC 100. A 1-bit signal is input to the multi-bit up/down counter 126 from the output 124 of the quantizer 120. From this, the multi-bit up/down counter 126 outputs a multi-bit signal.

The quantizer 120 and multi-bit up/down counter 126 together may be considered to be a tracking ADC. The quantizer 120 and multi-bit up/down counter 126 together, in some examples, may be replaced by a multi-bit quantizer. The multi-bit up/down counter 126 may be continuously clocked, and the input to the multi-bit up/down counter 126 comes from the output of the quantizer 120.

The number of bits of the quantizer 120 and multi-bit up/down counter 126 together (the tracking ADC) along with the first order noise shaping that is performed by the analogue filter 114 determine the achievable quantization noise.

The ADC 100 also comprises a main feedback DAC 132 having a main feedback converter input 134 and a main feedback converter output 136. The main feedback converter input 134 is connected to the counter output 130 of the multi-bit up/down counter 126. The main feedback converter output 136 is connected to the subtracting input 110 of the main summer 106. In the feedback loop, between the counter output 130 and the main summer subtracting input 110, the main feedback DAC 132 performs analogue conversion. The main feedback DAC 132 may be provided by any type of DAC that has comparable or better in-band resolution than the combined resolution of the quantizer 120, multi-bit up/down counter 126 and the analogue filter 114 (the forward path of the ADC 100).

For the ADC 100 shown in FIG. 1, the main feedback DAC 132 is configured to receive the multi-bit output signal 150 from the counter output 130.

Figure 2A:
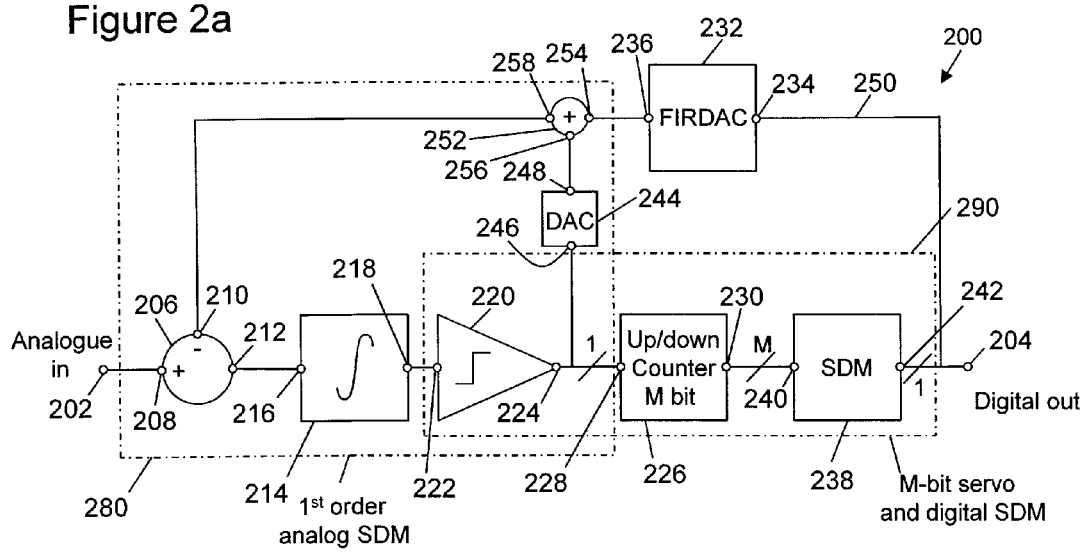
FIG. 2a illustrates a circuit diagram of another ADC comprising an SDM and a 1 bit intermediate DAC and FIG. 2b illustrates a circuit diagram of another ADC comprising an SDM, a 1 bit intermediate DAC, and a higher order SDM at the output of the ADC.

FIG. 2a illustrates a diagram of an analogue to digital converter (ADC) 200 with elements in common with the ADC illustrated in FIG. 1. Similar elements between figures have been provided with similar reference numerals, and common elements discussed in relation to FIG. 1 will not be discussed again in detail in relation to FIG. 2a.

The ADC 200 comprises a digital sigma delta modulator (SDM) block 238 having a digital modulator input 240 and a digital modulator output 242. The digital modulator input 240 is connected to the digital integrator output/counter output 230 of the digital integrator 226, which in this example is a multi-bit up/down counter 226. The digital modulator output 242 is connected to both the output terminal 204 and the main feedback converter input 234 of the main feedback DAC 232. The quantizer 220, multi-bit up/down counter 226 and digital SDM 238 may together be considered to be an M-bit servo and digital SDM 290.

As in FIG. 1, a 1-bit signal is input to the multi-bit up/down counter 226 from the output 224 of the quantizer 220. From this, the multi-bit up/down counter 226 outputs a multi-bit signal to the digital SDM block 238. The digital modulator output 242 from the digital SDM block 238 is connected to the main feedback converter input 234 of the main feedback DAC 232. The digital SDM block 238 receives a multi-bit input and outputs a 1-bit SDM signal having a particular order and oversampling ratio to provide a particular band resolution for the ADC 200.

In this example, the main feedback DAC 232 is a finite impulse response digital to analogue converter (FIRDAC). An example of a particularly suitable FIRDAC 232 is a 1-bit 32 tap FIRDAC, which has an inherently low distortion and scalable architecture. A suitable FIRDAC may advantageously be a simple component, for example comprising 32 flip-flops and resistors, which gives no, or low, signal distortion. In other examples the FIRDAC may be replaced with, for example, a multi-bit DAC.

A 1-bit output, as provided to the output terminal 204, can allow for easy interfacing of other components with the ADC 200 and can provide low distortion of output signals since the voltage level of the 1-bit output need not be matched with other output bits.

The ADC 200 of FIG. 2a also comprises an intermediate feedback DAC 244 which has an intermediate feedback converter input 246 and an intermediate feedback converter output 248. The intermediate feedback converter input 246 is connected to the quantizer output 224 of the quantizer 220. The ADC 200 further comprises an intermediate summer 252 having a first intermediate summing input 254, a second intermediate summing input 246 and an intermediate summing output 258. The first intermediate summing input 254 is connected to the main feedback converter output 236. The second intermediate summing input 256 is connected to the intermediate feedback converter output 248. The intermediate summing output 258 is connected to the subtracting input 210 of the main summer 206.

The intermediate feedback DAC 244 receives a 1-bit signal from the quantizer output 224. The intermediate feedback DAC 244 can beneficially be small, such as a 1 bit DAC having only two values (that is, a 1 tap DAC), for adequate stability. Thus, for lower frequency signals, signals on the feedback path through the digital circuitry (the multi-bit up/down counter 226, the digital SDM block 238 and the main feedback DAC 232) has a greater feedback effect than signals on the intermediate feedback path. At higher frequencies, the components in the ADC 200 may add a phase delay. Therefore at higher frequencies the signals that pass via the intermediate feedback DAC 244 have a greater feedback effect than those that pass via the feedback path through the digital circuitry. In this way, the (higher order) digital circuitry is effectively bypassed, and a first order transfer function remains. The first order transfer function is stable by default.

The analogue filter 214, quantizer 222 and intermediate feedback DAC 244 may be considered together as a first order analogue sigma delta modulator (SDM) 280. Sensitivity of the ADC 200 to clock jitter is determined by the first order analogue SDM 280. However, in the circuits described herein, the first order analogue SDM 280 operates at low amplitudes, so its sensitivity to clock jitter is also low.

The ADC 200 in this example only has one analogue component, which is the analogue filter 214. The low number of analogue components in the ADC 200 can help to maintain stability over a wide frequency sampling range, for example from 8 kHz (speech signals) to 48 kHz (mobile phone signals). Generally, SDMs can be unstable if a low sample rate is used. However, ADCs disclosed herein comprise an analogue filter 214, which is inherently stable. Furthermore, the higher order integration is moved into the digital domain, thereby allowing the ADC to operate adequately at low sample rates and thus low power, without losing stability.

The oversampling ratio for the quantizer 220 and the multi-bit up/down counter 226 should in some examples be 512 times the sampling frequency (512*fs) in order to achieve a 110 dB dynamic range for use with a 32 tap FIRDAC 232 in the audio band. Another consideration which requires the oversampling ratio to have a particular value is that the multi-bit up/down counter 226 can be limited by its slewrate. If input signal frequencies or amplitudes are too high then the multi-bit up/down counter 226 may not be able to react quickly enough to effectively follow signals received at its input. To address this, the oversampling ratio can be increased, and with that the slewrate of the multi-bit up/down counter 226 also increases. For input signal frequencies up to 20 kHz of full scale amplitude, an oversampling ratio of 1024 times the sampling frequency (1024*fs) can be used. A high oversampling ratio at the output 204 can lead to high power dissipation of a downstream decimator (not shown). This effect can be mitigated by using an ADC 200 as shown in FIG. 2*b*.

Figure 2B:
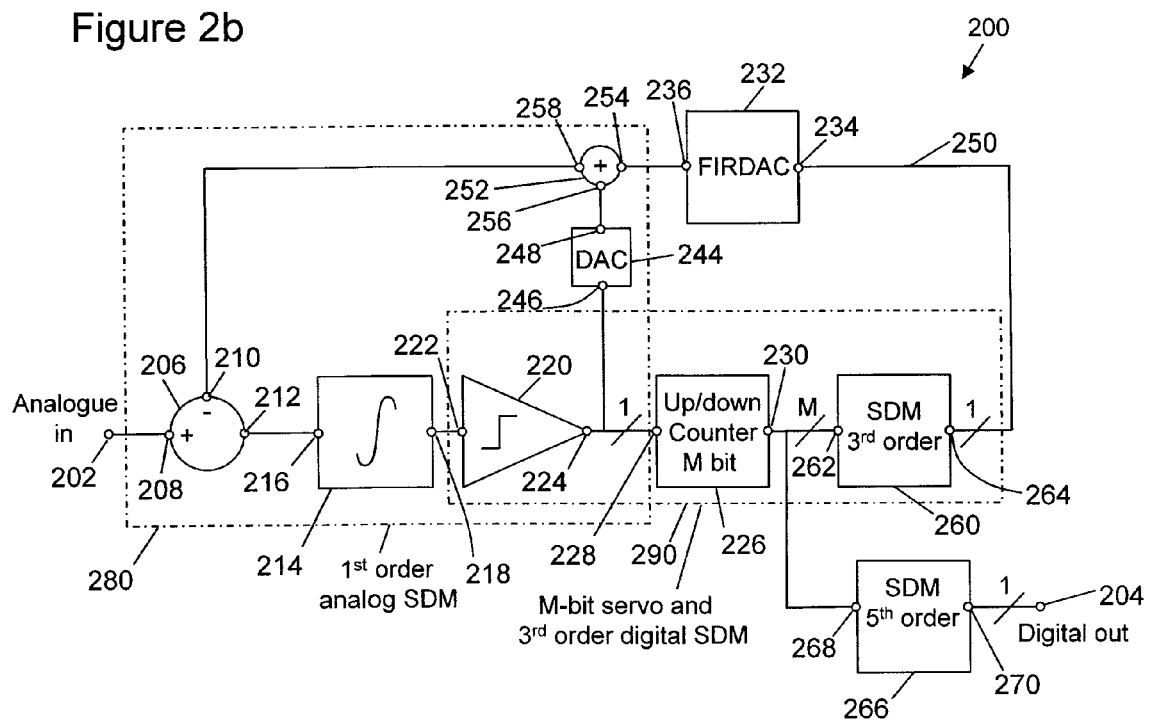

FIG. 2*b* illustrates a diagram of an analogue to digital converter (ADC) 200 with elements in common with the ADC illustrated in FIGS. 1 and 2*a*. Similar elements between figures have been provided with similar reference numerals, and common elements discussed in relation to FIG. 2*a* will not be discussed again in detail in relation to FIG. 2*b*.

The ADC 200 of FIG. 2*b* builds on that shown in FIG. 2*a*, and comprises a first digital sigma delta modulator block 260 having a first digital modulator input 262 and a first digital modulator output 264. The first digital modulator input 262 is connected to the counter output 230 and the first digital modulator output 264 is connected to the main feedback converter input 234. The ADC 200 also comprises a second digital sigma delta modulator block 266 having a second digital modulator input 268 and a second digital modulator output 270. The second digital modulator input 268 is connected to the counter output 230 and the second digital modulator output 270 is connected to the output terminal 204.

In FIG. 2*b*, the first digital sigma delta modulator block 260 is a third order sigma delta modulator, while the second digital sigma delta modulator block 266 is a fifth order sigma delta modulator. The first digital sigma delta modulator block 260 is therefore of a lower order than the second digital sigma delta modulator block 266. The quantizer 220, multi-bit up/down counter 226 and third order digital SDM 238 may together be considered to be an M-bit servo and third order digital SDM 290.

The first digital sigma delta modulator block 260 may apply a sampling frequency that is higher than the sampling frequency applied by the second digital sigma delta modulator block 266.

Regarding mitigating the effect of a high oversampling ratio leading to high power dissipation of a downstream decimator, a second higher order digital SDM block 266 may be used in addition to the first digital SDM block 260. The second higher order digital SDM block 266 may be run at a lower oversampling ratio than the first digital SDM block 260. For example, the first digital SDM block 260 may operate at an oversampling frequency of 512 times the sampling frequency (512*fs), while the second higher order digital SDM block 266 may operate at an oversampling frequency of 64, 128, 256 or 512 times the sampling frequency (64, 128, 256 or 512*fs). In this way the loop between the first digital modulator output 264 and the subtracting input 210 of the main summer 206 may be run at a high oversampling ratio, for dynamic range and slewrate requirements discussed in relation to FIG. 2*a*, while the output oversampling ratio from the second digital modulator output 270 of the second higher order digital SDM block 266 can still be at a lower oversampling ratio (such as 64 times the sample frequency (64*fs)). In this way power dissipation of a decimator connected to the output 204 of the ADC can be reduced due to a lower possible oversampling ratio at the output terminal 204 (while a high oversampling ratio can be maintained in the feedback loop). A decimator may be connected to the output of the ADC 200 and configured to reduce the sample rate back to the sampling frequency (fs).

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. An analogue to digital converter comprising:
   an input terminal configured to receive an analogue input signal;
   an output terminal configured to provide an output digital signal;
   a main summer having a summing input, a subtracting input and a summing output, wherein the summing input is connected to the input terminal;
   an analogue filter having a filter input and a filter output, wherein the filter input is connected to the summing output;
   a quantizer having a quantizer input and a quantizer output, wherein the quantizer input is connected to the filter output;
   a digital integrator having a digital integrator input and a digital integrator output, wherein the digital integrator output is configured to provide a multi-bit output signal, the digital integrator input is connected to the quantizer output, and the digital integrator output is connected to the output terminal;
   a main feedback digital to analogue converter having a main feedback converter input and a main feedback converter output, wherein the main feedback converter input is connected to the digital integrator output, and the main feedback converter output is connected to the subtracting input of the main summer; and
   an intermediate feedback digital to analogue converter having an intermediate feedback converter input and an intermediate feedback converter output, wherein the intermediate feedback converter input is connected to the quantizer output.

2. The analogue to digital converter of claim 1, wherein the main feedback digital to analogue converter that is configured to receive the multi-bit output signal from the digital integrator output.

3. The analogue to digital converter of claim 1, further comprising a digital sigma delta modulator block having a digital modulator input and a digital modulator output, wherein the digital modulator input is connected to the digital integrator output and the digital modulator output is connected to both the output terminal and the main feedback converter input.

4. The analogue to digital converter of claim 1, wherein the main feedback digital to analogue converter is a finite impulse response digital to analogue converter.

5. The analogue to digital converter of claim 1, further comprising:
   an intermediate summer having a first intermediate summing input, a second intermediate summing input and an intermediate summing output, wherein:
      the first intermediate summing input is connected to the main feedback converter output;
      the second intermediate summing input is connected to the intermediate feedback converter output; and
      the intermediate summing output is connected to the subtracting input of the main summer.

6. The analogue to digital converter of claim 1, further comprising:
   a first digital sigma delta modulator block having a first digital modulator input and a first digital modulator output, wherein the first digital modulator input is connected to the digital integrator output and the first digital modulator output is connected to the main feedback converter input; and
   a second digital sigma delta modulator block having a second digital modulator input and a second digital modulator output, wherein the second digital modulator input is connected to the digital integrator output and the second digital modulator output is connected to the output terminal.

7. The analogue to digital converter of claim 6, wherein the first digital sigma delta modulator block is a lower order than the second digital sigma delta modulator block.

8. The analogue to digital converter of claim 6, wherein the first digital sigma delta modulator block is configured to operate at an oversampling frequency that is higher than the oversampling frequency at which the second digital sigma delta modulator block is configured to operate.

9. The analogue to digital converter of claim 1, wherein the digital integrator is a multi-bit up/down counter.

10. The analogue to digital converter of claim 5, wherein the intermediate feedback digital to analogue converter is a 1-bit digital to analogue converter, and the main feedback digital to analogue converter is a multi-bit digital to analogue converter.

11. A sigma delta analogue to digital converter comprising:
a forward path between an input terminal and an output terminal; and
a feedback path between the output terminal and the input terminal wherein the feedback path includes an intermediate feedback digital to analogue converter having an intermediate feedback converter input and an intermediate feedback converter output, wherein the intermediate feedback converter input is connected to an quantizer output in the forward path;
wherein the forward path comprises an analogue filter, and digital componentry configured to receive an output signal from the analogue filter and provide a multi-bit output signal.

12. The sigma delta analogue to digital converter of claim 11 wherein the digital componentry comprises a multi-bit quantizer.

13. The sigma delta analogue to digital converter of claim 11, wherein the digital componentry comprises a quantizer in series with a digital integrator.

14. The sigma delta analogue to digital converter of claim 11, further comprising a digital sigma delta modulator block configured to receive the multi-bit output signal, and provide a digital modulator output signal to the output terminal.

15. A portable electronic device comprising the ADC as claimed in any one of claim 1.

16. An analogue to digital converter comprising:
an input terminal configured to receive an analogue input signal;
an output terminal configured to provide an output digital signal;
a main summer having a summing input, a subtracting input and a summing output, wherein the summing input is connected to the input terminal;
an analogue filter having a filter input and a filter output, wherein the filter input is connected to the summing output;
a quantizer having a quantizer input and a quantizer output, wherein the quantizer input is connected to the filter output;
a digital integrator having a digital integrator input and a digital integrator output, wherein the digital integrator output is configured to provide a multi-bit output signal, the digital integrator input is connected to the quantizer output, and the digital integrator output is connected to the output terminal;
a main feedback digital to analogue converter having a main feedback converter input and a main feedback converter output, wherein the main feedback converter input is connected to the digital integrator output, and the main feedback converter output is connected to the subtracting input of the main summer; and
a digital sigma delta modulator block having a digital modulator input and a digital modulator output, wherein the digital modulator input is connected to the digital integrator output and the digital modulator output is connected to both the output terminal and the main feedback converter input.

* * * * *